United States Patent
Gross

(10) Patent No.: US 8,911,555 B2
(45) Date of Patent: Dec. 16, 2014

(54) METHOD AND DEVICE FOR COATING SUBSTRATES FROM THE VAPOR PHASE

(75) Inventor: Harald Gross, Langebrück (DE)

(73) Assignee: VON ARDENNE Anlagentechnik GmbH, Dresden (DE)

( * ) Notice: Subject to any disclaimer, the term of this patent is extended or adjusted under 35 U.S.C. 154(b) by 51 days.

(21) Appl. No.: 13/387,402

(22) PCT Filed: Sep. 6, 2010

(86) PCT No.: PCT/EP2010/063031
§ 371 (c)(1),
(2), (4) Date: Mar. 21, 2012

(87) PCT Pub. No.: WO2011/026971
PCT Pub. Date: Mar. 10, 2011

(65) Prior Publication Data
US 2012/0177824 A1 Jul. 12, 2012

(30) Foreign Application Priority Data
Sep. 4, 2009 (DE) .................. 10 2009 040 086

(51) Int. Cl.
*C23C 16/00* (2006.01)
*C23C 14/12* (2006.01)
*C23C 14/24* (2006.01)
*C23C 14/54* (2006.01)

(52) U.S. Cl.
CPC .............. *C23C 14/12* (2013.01); *C23C 14/24* (2013.01); *C23C 14/541* (2013.01)
USPC ......................... 118/726; 118/727

(58) Field of Classification Search
USPC .................................. 118/726, 727
See application file for complete search history.

(56) References Cited

U.S. PATENT DOCUMENTS

| | | | |
|---|---|---|---|
| 2,269,169 A * | 1/1942 | Van Derhoef et al. ........ 430/531 |
| 2,319,195 A * | 5/1943 | Morton ......................... 348/164 |
| 3,436,293 A * | 4/1969 | Newman ....................... 156/240 |
| 3,452,181 A * | 6/1969 | Stryjewski ..................... 219/216 |
| 4,737,378 A * | 4/1988 | Narita et al. ...................... 427/8 |
| 4,748,313 A | 5/1988 | de Rudnay |
| 5,304,406 A | 4/1994 | Hongo |
| 5,346,385 A * | 9/1994 | McAleavey ................... 425/363 |
| 5,454,881 A * | 10/1995 | Fischer ......................... 148/241 |

(Continued)

FOREIGN PATENT DOCUMENTS

DE 101 28 091 C1 10/2002
DE 10 2005 013 875 A1 11/2006

(Continued)

OTHER PUBLICATIONS

International Search Report for PCT/EP2010/063031 dated Oct. 11, 2010.

(Continued)

*Primary Examiner* — Keath Chen
(74) *Attorney, Agent, or Firm* — Heslin Rothenberg Farley & Mesiti P.C.

(57) ABSTRACT

In a method for coating substrates with materials to be vaporized in a vacuum coating system, the vaporization material is deposited on the substrate by double vaporization using an intermediate carrier. The intermediate carrier is continuously moved and cylindrical.

18 Claims, 1 Drawing Sheet

(56) References Cited

U.S. PATENT DOCUMENTS

| | | | | |
|---|---|---|---|---|
| 5,746,737 | A * | 5/1998 | Saadat | 606/15 |
| 6,353,202 | B1 * | 3/2002 | Grotsch et al. | 219/121.63 |
| 6,383,690 | B1 * | 5/2002 | Vargas | 430/5 |
| 6,495,807 | B2 * | 12/2002 | Sakurai et al. | 219/497 |
| 6,759,171 | B1 * | 7/2004 | Kalk | 430/5 |
| 6,797,439 | B1 * | 9/2004 | Alpay | 430/5 |
| 7,094,193 | B2 * | 8/2006 | Belcastro et al. | 493/63 |
| 2001/0011524 | A1 * | 8/2001 | Witzman et al. | 118/718 |
| 2004/0007183 | A1 * | 1/2004 | Slyke et al. | 118/723 VE |
| 2004/0108047 | A1 * | 6/2004 | Afzali-Ardakani et al. | 156/230 |
| 2004/0159285 | A1 * | 8/2004 | Doehler et al. | 118/718 |
| 2004/0231590 | A1 * | 11/2004 | Ovshinsky | 118/718 |
| 2005/0072361 | A1 * | 4/2005 | Yang et al. | 118/726 |
| 2005/0087141 | A1 * | 4/2005 | Honda et al. | 118/726 |
| 2005/0281050 | A1 | 12/2005 | Chou | |
| 2009/0233006 | A1 * | 9/2009 | Yamazaki et al. | 427/554 |

FOREIGN PATENT DOCUMENTS

| | | |
|---|---|---|
| DE | 10 2009 007 587.9 A1 | 11/2009 |
| EP | 1 391 532 A1 | 2/2004 |
| JP | 57 009870 A | 1/1982 |
| JP | 59177365 A | 10/1984 |
| JP | H0361366 A | 3/1991 |
| JP | H0483871 A | 3/1992 |
| JP | H10330920 A | 12/1998 |
| JP | 2008173457 A | 7/2008 |
| WO | 2010/045974 A1 | 4/2010 |

OTHER PUBLICATIONS

Examination Report issued for corresponding Japanese patent application No. 2012-527346 dated Oct. 8, 2013.

* cited by examiner

METHOD AND DEVICE FOR COATING SUBSTRATES FROM THE VAPOR PHASE

CROSS REFERENCE TO RELATED APPLICATIONS

This application is a national stage filing under section 371 of International Application No. PCT/EP2010/063031 filed on Sept. 6, 2010, and published in German on Mar. 10, 2011 as WO 2011/026971 and claims priority of German application No. 10 2009 040 086.9 filed on Sept. 4, 2009, the entire disclosure of these applications being hereby incorporated herein by reference.

BACKGROUND ART

The invention relates to a method for coating substrates with materials to be vaporized in a vacuum coating system, wherein the material to be vaporized is heated in a vaporization device, vaporized and deposited on a substrate. The vaporization material is deposited on the substrate by double vaporization using an intermediate carrier, and the intermediate carrier is moved continuously.

The invention furthermore relates to a device for coating substrates with materials to be vaporized, comprising a vaporization device for vaporizing the materials to be vaporized inside a vacuum coating system. The vaporization device is in this case arranged for vaporizing vaporization materials in a first position. Opposite the side of the intermediate carrier intended to receive vapor deposition, a heating apparatus is arranged in a second position in spatial proximity to the substrate. An intermediate carrier is arranged movably between the first and second positions, means being provided for continuous movement of the intermediate carrier.

The coating of substrates with materials to be vaporized, in particular organic materials, in vacuum coating systems is conventionally carried out by means of point sources in which the organic materials are vaporized at a large distance of for example 50 cm from the substrate. In this way, a homogeneous layer thickness of the material deposited on the substrate is achieved.

For instance, DE 10 2005 013 875 A1 discloses a vacuum coating system comprising a heating apparatus, which is suitable for vaporizing organic materials.

Disadvantages with this, however, are primarily the low yield of the vaporization material, which often ranges only in the region of a few percent. This is unacceptable particularly for the case of organic materials, which constitute the main cost factor in the production of OLEDs and organic solar cells.

Methods and devices for co-vaporization of organic materials for the production of OLEDs are furthermore known.

In production systems, line sources are also used which are normally composed of nozzles arranged in a row in a vapor tube. For homogeneous layer deposition, a minimum distance in the centimeter range between the substrate and the vaporizer source is also required in this case, so that the yields usually lie in the range of between 50% and 70%.

DE 101 28 091 C1 discloses a device for coating a flat substrate by using such a line source.

For the production of layers of organic materials on a substrate, devices are known in which layers from different vaporization sources are deposited successively on the substrate.

The various materials are vaporized in different vaporization devices, and introduced into the process chamber through a gas inlet. The composition of the gas phase in the process chamber can be regulated by supplying inert gas or by pumping out. Disadvantages with this device and the associated method are, again, the low yields due to the separation between the vaporizer source and the substrate, particularly when a plurality of materials are vaporized simultaneously.

U.S. Pat. No. 4,748,313 A discloses a method for vaporizing inorganic materials, wherein two rotating drums are used. In a first step, the inorganic material is vaporized and deposited on the surface of the first rotating drum. In relative proximity to this rotating drum, a second rotating drum is arranged on which the substrate to be coated, for instance a film, is arranged. In the region of the shortest distance between the two drums, an electron beam gun is arranged inside the first drum, so that the deposited material is vaporized and deposited on the substrate on the second drum. The disadvantage with this arrangement consists primarily in the use of the electron beam gun, which is unsuitable for use when vaporizing organic materials. Furthermore, it is not possible to coat flat substrates with the device disclosed in U.S. Pat. No. 4,748,313 A.

EP 1 391 532 A1 discloses a method for producing a compact organic pellet for OLED production, the pellet being provided in a roll form. The pellet is subsequently transferred into a vaporization device, where it is heated and vaporized by the heating apparatuses arranged in the heating apparatus while rotating about its own axis. The material thus vaporized is then deposited on the substrate to be coated. A disadvantage in this case is, in particular, the elaborate production of the pellet from the organic materials.

US 2005/0281050 A1 discloses a method and a device for producing OLEDs. The substrates to be coated are conveyed along a transport path through a plurality of coating chambers. At the same time, the vaporization source is moved on a separate transport path between the individual coating chambers, so that a plurality of substrates can be coated in a shorter time. The disadvantage with this device resides primarily in the fact that the device proposed in US 2005/0281050 A1 and the associated method are unsuitable for ensuring continuous coating with the required throughput rates.

WO 2010/045974 A1 discloses a method and a device for coating substrates, wherein the organic material is vaporized and deposited on a carrier. The carrier is subsequently introduced into the vacuum coating chamber, where the organic material is vaporized for a second time and deposited on the substrate to be coated. The carrier is in this case configured in a strip shape from a flexible material. The disadvantage with using strip-shaped intermediate carriers resides primarily in the materials that can be used for the required flexibility, which leads to a great restriction in terms of the organic materials to be deposited.

German Patent Application No. 10 2009 007 587.9 provides a method and a device, the material to be vaporized being deposited on the substrate by double vaporization using an intermediate carrier. In this way, the material to be vaporized is not formed directly on the substrate by vaporization, but instead an intermediate carrier is used.

The material to be vaporized is vaporized for a first time by the vaporization device in a first position and deposited on the intermediate carrier, which is arranged position-variably in spatial proximity to the vaporization apparatus. This coated intermediate carrier is subsequently brought into a second position which lies in spatial proximity to a substrate to be coated, and the vaporization material deposited on the intermediate carrier is vaporized for a second time in the second position and deposited on the substrate. The intermediate carrier is in this case used for receiving the vaporized material and for deposition on the substrate to be coated. By using the intermediate carrier, it is possible to achieve greater yields in the range of 90% or more owing to the shorter separation. In contrast to known line sources, the high yields can even be achieved for narrow substrates and a plurality of simultaneously vaporized materials.

As intermediate carriers, German Patent Application No. 10 2009 007 587.9 indicates endless bands, for example steel bands, as well as circular disk-shaped intermediate carriers.

However, it has been found that endless bands made of steel cannot be produced in a form suitable for use as intermediate carriers. This is primarily because chemically inert steel bands, which are not meant to enter into a reaction with any of the organic materials deposited, are too brittle and therefore appear unsuitable for production as a steel band. Furthermore, it has been found that circular disk-shaped intermediate carriers for use in continuous coating systems with a diameter of more than 1 m cannot be produced with the required accuracy, or if so only with high outlay.

It is therefore an object of the present invention to provide a method and a device which make it possible to coat substrates with materials to be vaporized, in particular organic materials, with high yields.

It is a further object of the present invention to provide a method and a device which permit simultaneous coating of a substrate with materials to be vaporized, while ensuring a reproducible stoichiometry, which is constant inside the deposited layer, of the individual constituents throughout the coating process.

These objects are achieved by a method and a device according to the independent claims. Advantageous configurations of the invention are specified in the other claims.

BRIEF SUMMARY OF INVENTION

The material to be vaporized is deposited on the substrate by double vaporization using an intermediate carrier. In this way, the material to be vaporized of known vaporization apparatus is not formed directly on the substrate by vaporization, but instead an intermediate carrier is used. The the material to be vaporized is heated in a vaporization device, vaporized and deposited on a substrate, the vaporization material being deposited on the substrate by double vaporization using an intermediate carrier. The intermediate carrier is moved continuously.

According to the invention, the vaporization material is deposited on a cylindrically configured intermediate carrier, the intermediate carrier being moved about a rotation axis in a rotation direction by means of a drive system comprising drive rollers. The vaporization material deposited on the intermediate carrier is moved into a position which lies in spatial proximity to a substrate to be coated and a heating apparatus, where the vaporization material deposited on the intermediate carrier is vaporized once more by the heating apparatus and deposited on the substrate.

By using the intermediate carrier, it is possible to achieve greater yields in the range of 90% or more owing to the shorter separation. In contrast to known line sources, the high yields can even be achieved for narrow substrates and a plurality of simultaneously vaporized materials.

In another embodiment of the invention, the vaporization material is vaporized for a first time by the vaporization device in a first position and deposited on the intermediate carrier, which is arranged position-variably in spatial proximity to the vaporization apparatus. This coated intermediate carrier is brought into a second position which lies in spatial proximity to a substrate to be coated, and the vaporization material deposited on the intermediate carrier is vaporized for a second time in the second position and deposited on the substrate.

In another embodiment of the invention, a first vaporization material is heated for a first time by the vaporization device in the first position, vaporized and deposited on the intermediate carrier, which is arranged position-variably in spatial proximity to the vaporization device. A second vaporization material is subsequently heated for a first time in a further vaporization device, vaporized and deposited onto the first vaporization material deposited on the intermediate carrier, resulting in a layer system consisting of the first and second vaporization materials. The intermediate carrier is then heated by a heating apparatus in the second position on the opposite side of the intermediate carrier from the deposited vaporization material in the region of the substrate, the deposited vaporization materials being vaporized for a second time. In this way, mixing of the vaporization materials takes place predominantly in the vapor phase, so that deposition of the mixture of vaporization materials on the substrate in a constant stoichiometric composition is ensured. This applies in particular for the stoichiometry of the bottom to top coats of the deposited layer. In the context of the invention, the vaporizer source in the first position is independent and spatially separated from the subsequent second vaporizer source, so that thermal radiation from the first vaporizer source cannot reach the substrate and cannot heat it.

In one embodiment of the invention, organic material is used as material to be vaporized, for instance in OLED production.

In another embodiment of the invention, inorganic material is used as material to be vaporized. In the context of the invention, all inorganic materials may be used as materials to be vaporized, such as alkali metals or alkaline-earth metals, as well as metals, semimetals and nonmetals, so long as their boiling temperature lies below the melting or decomposition temperature of the intermediate carrier.

In another embodiment, the intermediate carrier is cooled by a cooling apparatus in the region of the vaporization apparatus. In this way, quantitative deposition of the vaporized material on the cooled intermediate carrier takes place, since the walls are heated to the vaporization temperature in the region of the vaporization apparatus in order to prevent deposition of the vaporized material.

In another embodiment, the second vaporization of the organic material deposited on the intermediate carrier in the second position is carried out by a heating apparatus on the opposite side of the intermediate carrier from the deposited organic material. In this way, the opposite side from the vapor-deposition side of the intermediate carrier is heated by the heating apparatus and the material deposited on the intermediate carrier is vaporized. In the context of the invention, both induction heating and thermal radiators, or heating by means of a laser beam or an electron beam or a flashlamp, may be used as heating apparatus.

In another embodiment, the vaporization of the organic material deposited on the intermediate carrier is carried out by a heating apparatus in the second position in the range of from $10^{-5}$ to 10 seconds. Rapid vaporization of the material deposited on the intermediate carrier is carried out in this way, which is advantageous in particular for temperature-sensitive substrates or temperature-sensitive materials already deposited, or organic layer systems.

In another configuration of the invention, the length of the vaporization space of the vaporization device is selected so that the layer thickness of the vaporization material deposited on the intermediate carrier can be adjusted. Based on the residence time of the intermediate carrier in the vaporization space of the vaporization device, which is dictated by the length of the vapor space, the layer thickness of the material to be deposited can be adjusted by means of the length of the vaporization space. The length of the vaporization space and the layer thickness of the material deposited on the intermediate carrier are therefore proportional. This method is advantageous in particular when using organic materials, in order to produce high deposition rates, since the decomposition temperature of many organic materials usually lies only minimally above the vaporization temperature.

In another configuration of the invention, the deposition of the various vaporization materials takes place in order of decreasing vaporization temperature of the vaporization materials, starting with the vaporization material which has the highest vaporization temperature. This is advantageous in order to avoid vaporization of the materials already deposited on the intermediate carrier, in a vapor-deposition chamber in which further materials are intended to be deposited on the intermediate carrier. Furthermore, damage to materials whose decomposition temperature lies only slightly above their vaporization temperature is to be avoided, for example in the case of organic materials. These could suffer damage during renewed exposure to higher temperatures.

Alternatively, it would be conceivable to configure the intermediate carrier in the form of a band, for instance an endless band or, as a rotating circular disk.

According to the arrangement-related solution to the object, the vaporization device for vaporizing organic materials is arranged in a first position, a heating apparatus is arranged opposite the side of the intermediate carrier intended to receive vapor deposition in a second position in spatial proximity to the substrate, and an intermediate carrier is arranged movably between the first and second positions, means being arranged for continuous movement of the intermediate carrier, and the intermediate carrier being configured as a cylinder, the latter having a rotation axis for rotation in a rotation direction.

In another embodiment, the intermediate carrier is configured as a quartz drum and comprises an absorber layer. The absorber layer is advantageous particularly in order to permit rapid heat input and therefore rapid vaporization of the deposited vaporization material from the intermediate carrier.

In another embodiment, the intermediate carrier is configured as a quartz drum and comprises an absorber layer consisting of $CrN/SiO_2$. Alternative absorber layers are molybdenum or tungsten. Owing to the higher thermal stability, the latter two materials can be used for the vaporization of metals such as aluminum.

In another embodiment, the distance between the intermediate carrier and the substrate is less than 50 mm, preferably less than 5 mm. A high yield of deposited organic material can be achieved owing to this small separation.

In another configuration of the invention, a cooling apparatus for cooling the intermediate carrier is arranged in the region of the vaporization device. Quantitative deposition of the vaporized material on the intermediate carrier is thereby ensured. In the context of the invention, the walls of the vaporization device are heated to vaporization temperature in order to prevent deposition of the vaporized material. The layer thickness of the deposited organic material in this case depends both on the length or width of the vapor space of the vaporization device and on the vapor pressure prevailing therein, as well as on the transport speed of the intermediate carrier. In order to produce high deposition rates, the vapor pressure or the vaporization temperature of the organic material therefore does not necessarily have to be increased; rather it is sufficient to increase the length of the vapor space. This is advantageous for many organic materials whose decomposition temperature lies only minimally above the vaporization temperature.

By cooling the intermediate carrier, in another embodiment, a plurality of organic materials with different vaporization temperatures can be deposited. In this case, it is particularly advantageous that the order of the deposition can be carried out independently of the vaporization temperatures of the individual organic materials owing to the cooling of the intermediate carrier. It is thereby possible to produce layer systems which, with excessively high vaporization temperatures, would otherwise be unstable for individual components.

In another embodiment of the invention, a cooling apparatus is arranged for cooling the substrate. In this way, the material vaporized in the second position is deposited quantitatively on the substrate lying a short distance away. For the vaporization of an organic material, this distance lies in the range of about 0.1 to 50 mm. For vaporizing a plurality of materials and mixing them in the gas phase, however, it is necessary to have a minimum distance which depends on many factors, such as vaporization temperature, amount of material and stoichiometry. Complete transfer of the organic material from the intermediate carrier to the substrate is thereby possible.

In another embodiment, a further vaporization device for vaporizing a second organic material is arranged between the vaporization apparatus in the first position and the substrate in the second position. In this way, a plurality of organic materials can be applied successively as a layer system onto the intermediate carrier. In the context of the invention, further vaporization devices, which lead to further layers on the intermediate carrier, may be arranged following the second vaporization device for depositing the second organic material. This layer system which has been formed is subsequently transported into the second position and vaporized there by means of the heating apparatus, so that a mixture of the organic materials is formed which is subsequently deposited on the substrate in constant stoichiometric ratios.

In the context of the invention, as an alternative to the organic material, it is also possible to use inorganic material as vaporization material so long as its vaporization temperature lies below the melting or decomposition temperature of the intermediate carrier.

In another embodiment of the invention, the heating apparatus is configured as a laser.

In another embodiment of the invention, the heating apparatus is configured as a halogen lamp.

In another embodiment of the invention, the heating apparatus is configured as a halogen lamp and comprises a cooled shutter.

In another embodiment of the invention, the heating apparatus is configured as a flashlamp, for example as a xenon flashlamp. The heat input onto the substrate can thereby be minimized, so that even particularly temperature-sensitive substrates can be coated.

In another embodiment of the invention, a further vaporization device for vaporizing a second vaporization material is arranged between the vaporization device in the first position and the substrate in the second position. This is advantageous in particular when co-vaporization of two or more materials is intended to be carried out with the device according to the invention.

In another embodiment of the invention, heated vapor shutters are arranged in the region of the vapor tubes of the first and second vaporization devices. These are advantageous in particular for maximizing the yields of the materials deposited.

BRIEF DESCRIPTION OF DRAWING FIGURES

The invention will be explained in more detail below with the aid of an exemplary embodiment. In the associated drawings.

DETAILED DESCRIPTION

Figure 1:
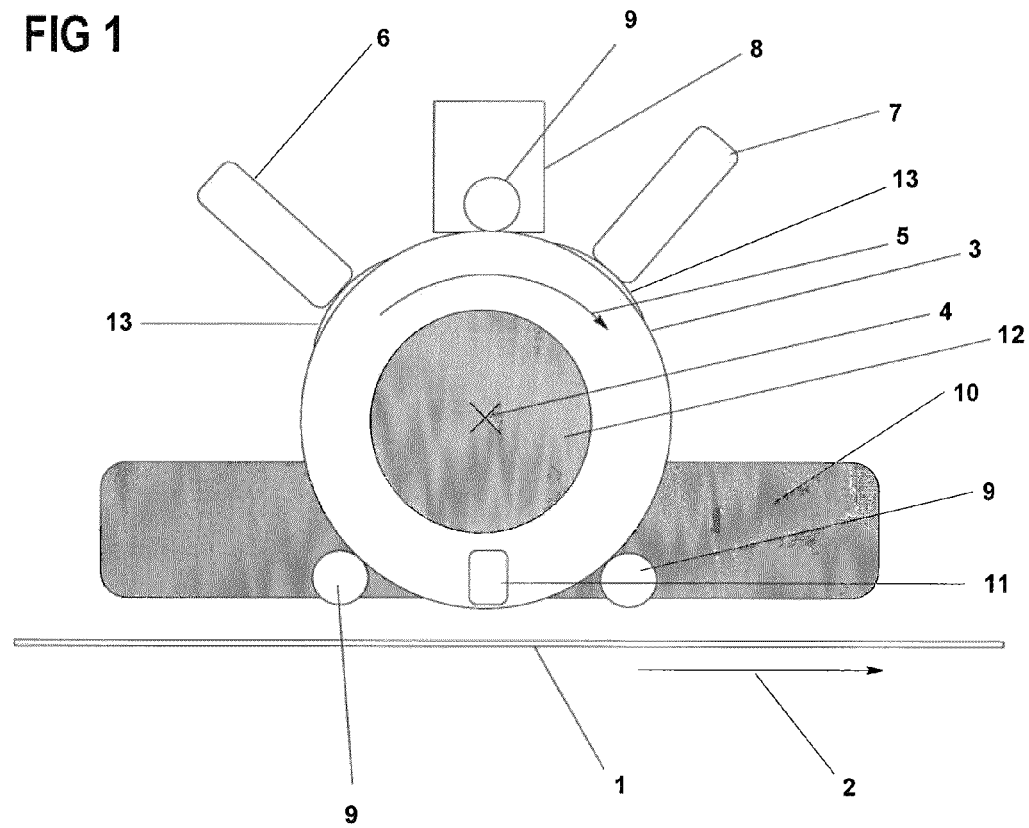
FIG. 1 shows a schematic cross-sectional view of an exemplary embodiment according to the invention, comprising a cylindrical intermediate carrier.

In a continuous coating system in FIG. 1, a cylindrical intermediate carrier 3 is used for coating the substrate 1, which is transported continuously in a substrate transport direction 2, with vaporization material. The cylindrical intermediate carrier 3 may, for example, consist of a quartz drum which is coated with an absorber layer consisting of CrN/ $SiO_2$, the $SiO_2$ layer being intended to prevent possible oxidation of the CrN layer. The external diameter of the quartz drum in the present exemplary embodiment is 300 mm. The wall thickness of the quartz drum is 10 mm. The cylindrical intermediate carrier 3 rotates with a constant speed about the rotation axis 4 and in the rotation direction 5.

The coating of the intermediate carrier 3 with a first vaporization material is carried out by means of a vapor tube 6 of the first vaporization apparatus in a first position. The vapor tube may, for example, consist of SiC and comprise a line source with a rectangular box fixture. After the intermediate carrier 3 has been coated with a first vaporization material in the first position, owing to the continuous movement of the intermediate carrier 3, the region of the surface of the intermediate carrier 3 coated with the first vaporization material is rotated to a second vapor tube 7 of a second vaporization apparatus in a second position. There, coating with a second vaporization material takes place in a similar way. It is to be noted here that the vaporization temperature of the second vaporization material must be lower than that of the first vaporization material in the first position. Otherwise, the hotter vapor tube 7 of the second material with a higher vaporization temperature would heat the intermediate carrier 3 so strongly that the material with a lower vaporization temperature, which has already been deposited under the vapor tube 6, would undesirably be vaporized in the second position. In order to minimize the thermal influence of the first and second vapor tubes 6 and 7, shielding plates 8 which reduce radiant heat are provided. This allows mutually independent regulation of the two vapor tubes, and the resulting deposition rates.

Owing to the continuous rotational movement 5 of the intermediate carrier 3, the region of the surface of the intermediate carrier 3, which has been coated with the first and second vaporization materials, is moved into a third position at a heating apparatus 11. This is arranged inside the quartz drum, on the opposite side to the coated surface of the intermediate carrier 3. The coated surface of the intermediate carrier 3 enters this position in spatial proximity to the substrate 1, which in the present exemplary embodiment is separated by a distance of about 5 mm from the quartz drum's surface coated with the vaporization materials, and is moved continuously past the intermediate carrier 3 in the substrate transport direction 2.

In order to deposit the vaporization materials on the substrate 2, these are heated and vaporized in the $3^{rd}$ position by means of the heating apparatus 11. As a result of this, the vaporization materials are deposited on the substrate. Advantageously, the substrate is cooled in the region of the heating apparatus 11 by a cooling apparatus (not shown), in order to ensure quantitative deposition of the vaporization materials on the substrate 2. The heating apparatus 11 may, for example, be configured as a halogen rod lamp with a power of about 20 W/cm. A cooled shutter (not shown) may furthermore be provided in front of the heating apparatus 11. This is advantageous in particular for regulating the power of the heating apparatus 11, in that an aperture can regulate the angle of the heat input coming from the heating apparatus 11 onto the coated region of the surface of the intermediate carrier 3 and the radiant power delivered can be adjusted. The aim is to heat only the absorber. The heating power should not be carried out by means of the supply of current to the halogen lamp, since in this case the emission spectrum would be shifted into the infrared range and the quartz glass intermediate carrier 3 would therefore undesirably be heated more strongly. The aperture of the cooled shutter is in this case used as a means of coarsely adjusting the radiant power of the heating apparatus 11. Fine adjustment could additionally be carried out by means of the rotational speed of the intermediate carrier 3, although this is not absolutely required since it is merely necessary to reach a temperature above the vaporization temperatures of the two materials.

As an alternative to the halogen lamp, it is also possible for a focused laser beam, which is scanned on a narrow line in position 3 along the lengthwise axis of the intermediate carrier 3, to be used as the heat source. An advantage in this case is that both organic materials are vaporized on this line owing to the rapid heating to high temperatures. The achievable tolerance of the stoichiometry of the two materials over the layer deposited on the substrate is therefore less. The wavelength of the laser must be selected so that it is not absorbed by the intermediate carrier 3. Here, for example, a solid-state laser with a wavelength of about 1 μm is suitable.

In order to cool the absorber layer on the surface of the quartz drum, water-cooled surfaces 10 are provided which cover a part of the intermediate carrier 3. The water-cooled surfaces 10 may be configured as metal components through which cooling water flows. Owing to the water-cooled surfaces 10, indirect cooling of the quartz drum has taken place by absorption of the heat radiation.

Furthermore, for example, a further means of indirectly cooling the quartz drum may consist of a cooling apparatus 12 which, for example, consists of a stationary cooling water tube that is arranged inside the quartz drum and has a radiation-absorbing outer wall.

In order to maximize the yields of the materials deposited, heated vapor shutters 13 may furthermore be provided in the first and second positions in the region of the vapor tubes 6, 7 of the first and second vaporization devices. The distance between the quartz drum and the shutter 13 is in this case about ⅕ of half the shutter length. With a distance of 2 mm between the quartz drum and the shutter 13, the shutter length of the heated vapor shutter 13 is therefore about 20 mm.

Figure 2:
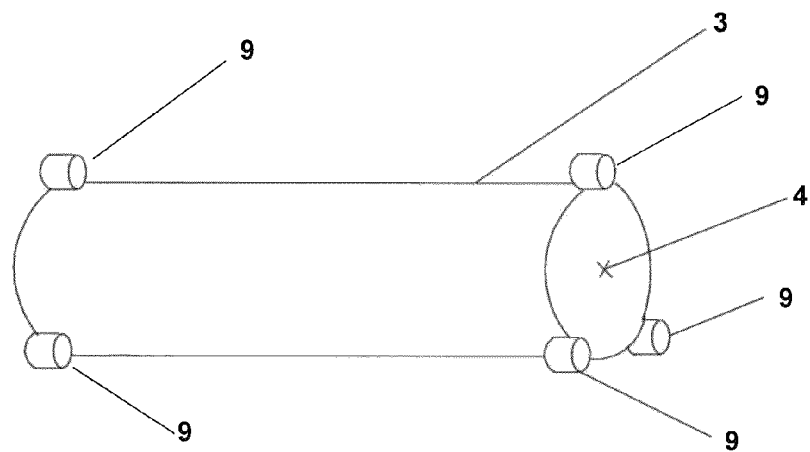
FIG. 2 shows a schematic representation of a cylindrical intermediate carrier according to the invention, comprising a drive system.

The intermediate carrier 3 is driven by means of drive rollers 9 which, as represented in FIG. 2, are respectively arranged in the edge region of the intermediate carrier 3. Contact of the drive rollers 9 with the coated region of the surface of the intermediate carrier 3 is thereby avoided, in order to prevent impairment of the layer quality. The drive rollers 9 may for example be made of a rubber, since the temperature of the intermediate carrier at this position is much less than 100° C.

The amount of material deposited is dictated by a combination of the substrate transport speed and the amount of material vaporized, which is deposited on the intermediate carrier through the vapor tubes 6, 7. The layer thickness of the material deposited on the substrate 2 can therefore be adjusted accordingly by means of the aforementioned parameters. The rotational speed of the intermediate carrier, however, does not influence the deposition rate.

In one exemplary embodiment of the vacuum coating system described above, an organic material is used as vaporization material.

In another exemplary embodiment of the vacuum coating system described above, an inorganic material is used as vaporization material.

In another exemplary embodiment of the vacuum coating system described above, the inorganic material used is a metal whose vaporization temperature lies below the melting or decomposition temperature of the intermediate carrier 3.

The invention claimed is:

1. A coating device for coating substrates with organic material by double vaporization, comprising:
   a first vaporization device vaporizing an organic material inside a vacuum coating system,
   an intermediate carrier comprising a quartz drum bearing a heat absorber layer and having a rotation axis for rotation of the intermediate carrier in a rotation direction between a first position spatially proximate the first vaporization device, at which the vaporized organic material is deposited on the intermediate carrier, and a second position spatially proximate a substrate,
   a heating apparatus arranged inside the intermediate carrier and configured to heat the absorber layer with radiation having a wavelength minimally absorbed by the intermediate carrier, and re-vaporize the organic material on the intermediate carrier when the intermediate carrier is in the second position,
   a cooling apparatus for cooling the substrate in a region of the heating apparatus, and water cooled surfaces covering a part of the intermediate carrier between the first vaporization device and the heating apparatus, on both sides of the heating apparatus, to cool the absorber layer, and
   a drive system comprising drive rollers arranged in an edge region of the intermediate carrier for continually rotating the intermediate carrier from the first position to the second position, while avoiding roller contact with the organic material on the intermediate carrier.

2. The coating device as claimed in claim 1, wherein the absorber layer comprises a layer of CrN overlaid with a layer of SiO$_2$ for preventing oxidation of the CrN layer.

3. The coating device as claimed in claim 1, wherein the absorber layer comprises molybdenum.

4. The coating device as claimed in claim 1, wherein the absorber layer comprises tungsten.

5. The coating device as claimed in claim 1, wherein distance between the intermediate carrier and the substrate is less than 50 mm.

6. The coating device as claimed in claim 1, wherein distance between the intermediate carrier and the substrate is less than 5 mm.

7. The coating device as claimed in claim 1, further comprising a cooling apparatus for cooling the intermediate carrier arranged in a region of the vaporization device.

8. The coating device as claimed in claim 1, wherein the heating apparatus comprises a laser having a wavelength that is not absorbed by the intermediate carrier, and configured to scan a focused laser beam on a line along a lengthwise axis of the intermediate carrier.

9. The coating device as claimed in claim 1, wherein the heating apparatus comprises a halogen lamp and a cooled shutter having an aperture that adjusts radiant power of the heating apparatus.

10. The coating device as claimed in claim 1, wherein the heating apparatus comprises a flashlamp.

11. The coating device as claimed in claim 1, wherein a further vaporization device vaporizing a second vaporization material is arranged between the first vaporization device in the first position and the substrate in the second position, and wherein the further vaporization device is operated at a lower temperature than the first vaporization device.

12. The coating device as claimed in claim 11, wherein each of the first vaporization device and the further vaporization device comprises a vapor tube, and further comprising a heated vapor shutter arranged in a region of each vapor tube.

13. The coating device as claimed in claim 11, further comprising a heat shielding plate separate from and arranged intermediate of said first vaporization device and said further vaporization device.

14. The coating device as claimed in claim 1, further comprising cooling apparatus located within the quartz drum.

15. The coating device as claimed in claim 14, wherein the cooling apparatus comprises a stationary cooling water tube arranged inside the quartz drum and having a radiation absorbing outer wall to indirectly cool the quartz drum.

16. The coating device as claimed in claim 1, in combination with a flat substrate to be coated by the coating device.

17. The coating device as claimed in claim 1, wherein the drive rollers are arranged to rotate about axes parallel to and displaced from the rotation axis of the intermediate carrier.

18. The coating apparatus as claimed in claim 17, wherein the drive rollers comprise a plurality of rollers arranged in the edge region at each of two opposite ends of the intermediate carrier.

* * * * *